United States Patent
Zhou

(10) Patent No.: US 10,553,539 B2
(45) Date of Patent: Feb. 4, 2020

(54) INTERCONNECT STRUCTURE WITH POROUS LOW K DIELECTRIC AND BARRIER LAYER

(71) Applicant: SEMICONDUCTOR MANUFACTURING INTERNATIONAL (SHANGHAI) CORPORATION, Shanghai (CN)

(72) Inventor: Ming Zhou, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 11 days.

(21) Appl. No.: 15/633,630

(22) Filed: Jun. 26, 2017

(65) Prior Publication Data
US 2017/0309513 A1    Oct. 26, 2017

Related U.S. Application Data

(62) Division of application No. 14/815,813, filed on Jul. 31, 2015, now Pat. No. 9,721,892.

(30) Foreign Application Priority Data

Aug. 13, 2014   (CN) .......................... 2014 1 0398110

(51) Int. Cl.
*H01L 23/532*     (2006.01)
*H01L 21/768*     (2006.01)
(Continued)

(52) U.S. Cl.
CPC .. *H01L 23/53238* (2013.01); *H01L 21/02203* (2013.01); *H01L 21/7684* (2013.01);
(Continued)

(58) Field of Classification Search
CPC ......... H01L 21/31127; H01L 21/02074; H01L 23/53238
See application file for complete search history.

(56) References Cited

U.S. PATENT DOCUMENTS 6,887,783 B2    5/2005  Chen et al.
2003/0214043 A1  11/2003  Saitoh et al.
(Continued)

OTHER PUBLICATIONS

U.S. Appl. No. 14/815,813, Final Office Action dated Jan. 6, 2017, 11 pages.
(Continued)

*Primary Examiner* — Changhyun Yi
(74) *Attorney, Agent, or Firm* — Kilpatrick Townsend & Stockton LLP

(57) ABSTRACT

A semiconductor device includes a semiconductor substrate, a porous low-k dielectric layer, a copper interconnect structure in the porous low-k dielectric layer, a diffusion barrier layer disposed between the copper interconnect structure and the porous low-k dielectric layer, and a silicon nitride layer disposed between the diffusion barrier layer and the porous low-k dielectric layer The low-k dielectric layer has a smooth and dense surface that increases the adhesion strength between the low-k dielectric layer and the diffusion barrier layer to improve reliability and yield of the semiconductor device.

12 Claims, 6 Drawing Sheets

(51) Int. Cl.
*H01L 21/02* (2006.01)
*H01L 23/522* (2006.01)

(52) U.S. Cl.
CPC .. *H01L 21/76802* (2013.01); *H01L 21/76814* (2013.01); *H01L 21/76826* (2013.01); *H01L 21/76831* (2013.01); *H01L 21/76843* (2013.01); *H01L 21/76877* (2013.01); *H01L 23/5226* (2013.01); *H01L 23/5329* (2013.01); *H01L 23/53295* (2013.01); *H01L 2924/0002* (2013.01)

(56) References Cited

U.S. PATENT DOCUMENTS

| | | |
|---|---|---|
| 2004/0129673 A1 | 7/2004 | Belyansky et al. |
| 2005/0079703 A1 | 4/2005 | Chen et al. |
| 2006/0118955 A1* | 6/2006 | Liu .................. H01L 21/31116 257/753 |
| 2007/0004230 A1* | 1/2007 | Johnston ........... H01L 21/02074 438/785 |
| 2010/0178761 A1* | 7/2010 | Chen ................. H01L 21/76898 438/613 |
| 2013/0087930 A1* | 4/2013 | Meinhold ............... H01L 24/48 257/782 |
| 2014/0084486 A1* | 3/2014 | Zhang ............... H01L 21/31127 257/774 |
| 2016/0049328 A1 | 2/2016 | Zhou |

OTHER PUBLICATIONS

U.S. Appl. No. 14/815,813, Non-Final Office Action dated Jul. 21, 2016, 8 pages.

U.S. Appl. No. 14/815,813, Notice of Allowance dated Apr. 6, 2017, 7 pages.

U.S. Appl. No. 14/815,813, Restriction Requirement dated Apr. 4, 2016, 6 pages.

* cited by examiner

INTERCONNECT STRUCTURE WITH POROUS LOW K DIELECTRIC AND BARRIER LAYER

CROSS-REFERENCES TO RELATED APPLICATIONS

This application is a divisional application of U.S. application Ser. No. 14/815,813, filed Jul. 31, 2015, which claims priority to Chinese patent application No. 201410398110.8, filed Aug. 13, 2014, the contents of which are incorporated herein by reference in their entireties.

BACKGROUND OF THE INVENTION

The present invention relates to a semiconductor structure and method of manufacture, and more particularly to a semiconductor device and manufacturing method thereof.

With the continuous decrease of semiconductor feature sizes, capacitive crosstalk between metal interconnect layers has a significant impact on semiconductor device performance. The use of a porous low-k dielectric layer disposed between metal interconnect layers is a good way to solve the problem of capacitive crosstalk.

The number of metal interconnect layers in a logic circuit of a semiconductor device may range from a few to more than 10 layers, each of the metal interconnect layers forms a respective layer of a metal interconnect structure. Referring to FIG. 1A, a front-end device may have an etch stop layer 101 disposed on a semiconductor substrate 100 and a porous low-k dielectric layer 102 disposed on etch stop layer 101, a metal interconnect structure 103 is formed by dry etching in porous dielectric layer 102. Metal interconnect structure 103 includes a through-hole 103a and a trench 103b. Referring to FIG. 1B, a diffusion barrier layer 104 is formed by a physical vapor deposition process on sidewalls and bottoms of metal interconnect structure 103. Diffusion barrier layer 104 comprises Ta/TaN. Then, a copper seed layer and a copper interconnect layer are sequentially formed. However, in the conventional process, the interface surface between the porous low-k dielectric layer and the diffusion barrier layer is rough, leading to poor adhesion between the porous low-k dielectric layer and the diffusion barrier layer, thereby reducing yield and electrical interconnect performance of the semiconductor device.

For these and other reasons there is a need for the present invention.

BRIEF SUMMARY OF THE INVENTION

Embodiments of the present invention provide a method for manufacturing a semiconductor device. The method includes providing a semiconductor substrate, forming a porous low-k dielectric layer on the semiconductor substrate, forming a through-hole and a trench of a copper interconnect structure, performing a helium plasma treatment on an exposed surface of the porous low-k dielectric layer, performing a nitrogen plasma treatment on the exposed surface of the porous low-k dielectric layer to form a thin silicon nitride layer, and forming a diffusion barrier layer on bottoms and sidewalls of the through-hole and the trench of the copper interconnect structure.

In one embodiment, the method further includes performing an argon plasma treatment on the silicon nitride layer. The argon plasma treatment is performed at a flow rate in a range between 100 and 10,000 sccm, a power in a range between 50 and 5000 W, and a pressure in a range between 0.1 mTorr and 10 Torr.

In one embodiment, the helium plasma treatment includes a helium flow rate in a range between 100 and 10,000 sccm, a power in a range between 50 and 5000 W, and a pressure in a range between 0.1 mTorr and 10 Torr.

In one embodiment, the nitrogen plasma treatment is an in-situ treatment. The nitrogen plasma in-situ treatment includes a flow rate in a range between 100 and 10,000 sccm, a power in a range between 50 and 5000 W, and a pressure in a range between 0.1 mTorr and 10 Torr.

In one embodiment, the nitrogen plasma treatment includes a gas mixture of hydrogen, nitrogen, and argon.

In one embodiment, the silicon nitride layer has a thickness in a range between 10 Angstroms and 80 Angstroms.

In one embodiment, the method further includes, after forming the diffusion barrier layer, filling the through-hole and the trench of the copper interconnect structure with a copper interconnect layer, and performing a chemical mechanical polishing process on the semiconductor substrate until a top surface of the porous low-k dielectric layer is exposed.

Embodiments of the present invention also provide a semiconductor device comprising: a semiconductor substrate, a porous low-k dielectric layer, a copper interconnect structure in the porous low-k dielectric layer, a diffusion barrier layer disposed between the copper interconnect structure and the porous low-k dielectric layer, and a silicon nitride layer disposed between the diffusion barrier layer and the porous low-k dielectric layer. In one embodiment, the silicon nitride layer has a thickness in a range between 10 Angstroms and 80 Angstroms.

Embodiments of the present invention also provide an electronic device containing the above-described semiconductor device.

The following description, together with the accompanying drawings, will provide a better understanding of the nature and advantages of the claimed invention.

DETAILED DESCRIPTION OF THE INVENTION

Figure 1A:
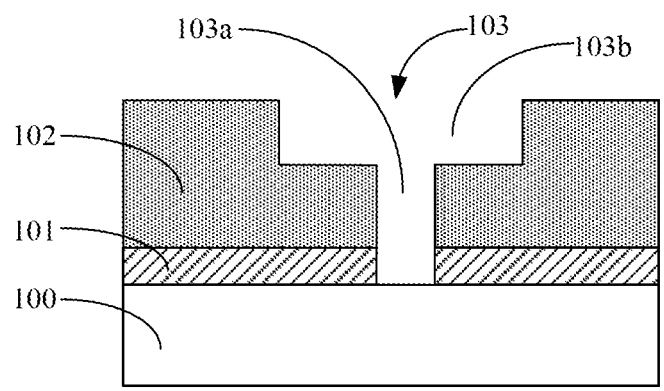
FIG. 1A is a cross-sectional view illustrating a trench and a through-hole of a metal interconnect structure of a front-end device according to the prior art.
Figure 1B:
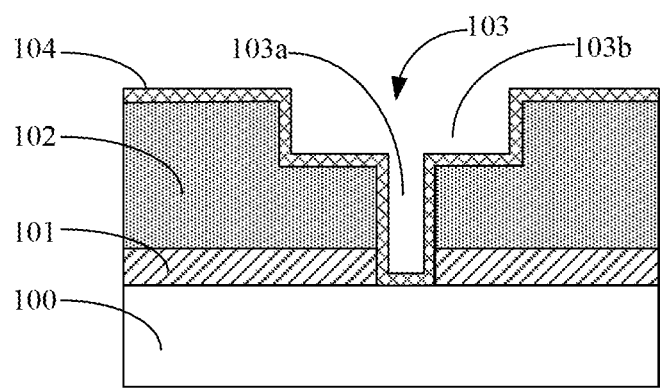
FIG. 1B is a cross-sectional view illustrating a diffusion barrier layer formed on the trench and the through-hole of the metal interconnect structure of FIG. 1A according to the prior art.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The present invention will now be described more fully herein after with reference to the accompanying drawings, in which preferred embodiments of the invention are shown. This invention may, however, be embodied in many different forms and should not be construed as limited by the embodiments set forth herein. Rather, these embodiments are provided so that this disclosure will be thorough and complete, and will fully convey the scope of the invention to those skilled in the art.

Embodiment 1

FIGS. 2A through 2F are simplified cross-sectional views illustrating stages of process steps of forming a semiconductor device according to an embodiment of the present invention.

Figure 2A:
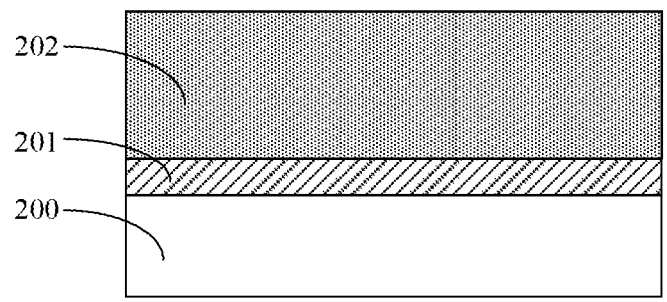
FIGS. 2A through 2F are cross-sectional views depicting stages of a method of manufacturing a semiconductor device according to an embodiment of the present invention.

Referring to FIG. 2A, a semiconductor substrate 200 is provided. Semiconductor substrate 200 can be made of undoped silicon, doped silicon, silicon on insulator (SOI) and the like. By way of an example, semiconductor substrate 200 includes a monocrystalline silicon material. One or more isolation structures and well structures may be formed in semiconductor substrate 200, which are not shown herein for the sake of clarity.

One or more front-end devices may be formed on semiconductor substrate 200, which are not shown herein for the sake of clarity. The term "front-end" device is referred to herein as a semiconductor device structure before the back-end-of-the line (BEOL). The term front-end device is not intended to limit the semiconductor device structure to a particular form disclosed.

Still referring to FIG. 2A, an etch stop layer 201 is formed on semiconductor substrate 200, and a porous low-k dielectric layer 202 is formed on etch strop layer 201.

Etch stop layer 201 may be made of SiCN, SiC, or SiN, and functions as an etch stop layer at the time of forming a through-hole of a copper interconnect structure to connect to a front-end device, and to prevent copper of the copper interconnect structure from diffusing into the front-end device.

Porous low-k dielectric layer 202 may be made of low-k materials having a dielectric constant k less than 4.0. Porous low-k dielectric layer 202 may be made of, but not limited to, SiO2, SiCOH, hydrogen silsesquioxane (HSQ with k=2.5 to 2.9), methyl silsesquioxane (MSQ with k=2.2), SiCH, SiCNH, $SiN_x$, and the like.

Porous low-k dielectric layer 202 may be formed using a spin-on-glass (SOG) coating process, rejection glue process, or chemical vapor deposition process. In an exemplary embodiment, porous low-k dielectric layer 202 is formed using a plasma chemical vapor deposition process, for example, an organic silicon source gas can be used that comprises two source types of a chain structure and a ring structure, and an added gas of a porogen (a pore-forming material) and an oxidizing agent (oxidizer). The organic silicon source gas can be selected from one or any combinations of tetramethylsilane (TMS), trimethylsilane (3MS), bis trimethylsilyl methane (BTMSM), methyldiethoxylane (DEMS), tetramethyl cyclotetrasiloxane (TMCTS), tetravinyl tetramethyl cyclotetrasiloxane (TVTMCTS), trivinyl trimethyl cyclotrisiloxane ($V_3D_3$), decamethyl cyclopentasiloxane ($D_5$). Porogens may include any suitable poreforming materials. Porogens may include norbornene, 5-dimethyl-1.4-cyclooctanediene, decalin, ethylbenzene, limozene, or any combinations thereof. For example, porogens may include α-terpinene (ATRP), oxidizer may include $O_2$, $N_2O$, $CO_2$, or any combinations thereof.

Thereafter, the porous low-k dielectric layer is submitted to a curing treatment to further reduce the dielectric constant while improving its mechanical strength. The curing treatment may be performed in a furnace or using other curing processes, such as ultraviolet curing, rapid thermal curing, flash curing, laser curing, and the like.

Figure 2B:
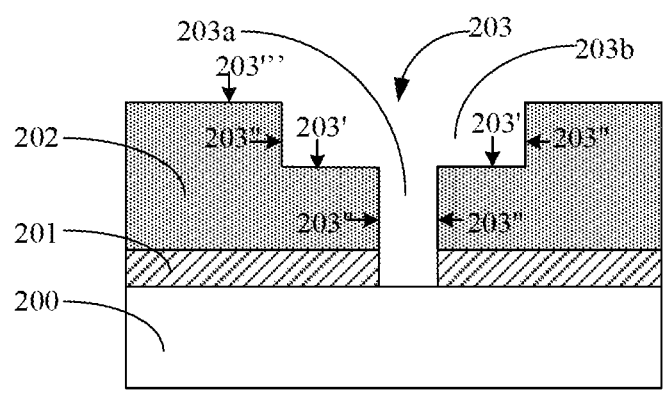

Referring to FIG. 2B, a copper interconnect structure 203 is formed including a though-hole 203a and a trench 203b. Through-hole 203a and trench 203b of copper interconnect structure 203 may be formed using any existing processes known to those of skill in the art, such as a dual damascene process.

Thereafter, the exposed surface of the porous low-k dielectric layer is submitted to a helium plasma treatment. The exposed surface of the porous low-k dielectric layer includes the bottom surfaces 203' and sidewall surfaces 203" of through-hole 203a and trench 103b of copper interconnect structure 203. The exposed surface of the porous low-k dielectric layer also includes a top surface 203'. In an exemplary embodiment, the helium plasma treatment includes a helium flow rate of 100 to 10000 sccm, a power of 50 to 5000 W, a pressure of 0.1 mTorr to 10 Torr. Through the helium treatment, the surface of porous low-k dielectric layer 202 becomes more dense.

Figure 2C:
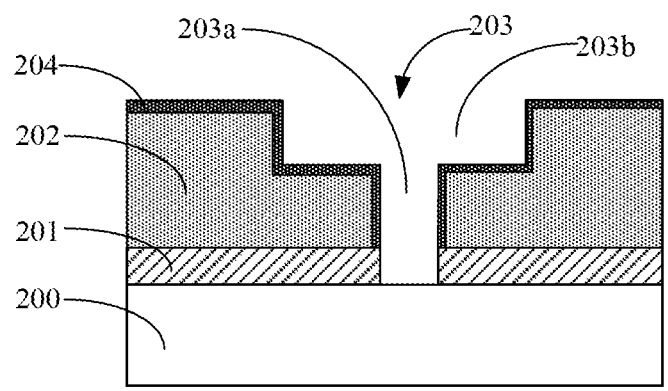

Referring to FIG. 2C, porous low-k dielectric layer 202 is submitted to a nitrogen or a nitrogen-containing plasma treatment to form a thin silicon nitride layer 204 on the exposed surface of the porous low-k dielectric layer.

In an embodiment, the nitrogen or nitrogen-containing plasma treatment is performed in situ (nitrogen plasma in-situ treatment). The nitrogen plasma treatment on the exposed surface of porous low-k dielectric layer 202 may be performed using hydrogen, nitrogen or argon gas or a gas mixture of hydrogen, nitrogen and argon. In one embodiment, the nitrogen-containing plasma treatment may be an ammonia ($NH_3$) plasma treatment. In another embodiment, the nitrogen-containing plasma treatment may be a hydrazine ($N_2H_4$) plasma treatment.

In an embodiment, the nitrogen or nitrogen-containing plasma in-situ treatment includes a nitrogen flow rate of 100 to 10000 sccm, a power of 50 to 5000 W, a pressure of 0.1 mTorr to 10 Torr.

In an embodiment, through the reaction gas and suitable process parameters, a thin layer of silicon nitrite is formed on the exposed surface of porous low-k dielectric layer 202. In an embodiment, the thin layer of silicon nitride has a thickness in the range between 10 Angstroms and 80 Angstroms. The thickness of the silicon nitride layer may be controlled by adjusting the nitrogen or nitrogen-containing plasma treatment process parameters. The thickness of the thin silicon nitride layer may be adjusted to ensure that the dielectric constant of porous low-k dielectric layer 202 is within an appropriate range.

Thereafter, an argon or krypton plasma treatment is performed on the exposed surface of the porous low-k dielectric layer. The argon or krypton plasma treatment is performed at a flow rate of 100 to 10000 sccm, a power of 50 to 5000 W, a pressure of 0.1 mTorr to 10 Torr. Through the argon or krypton plasma treatment on the exposed surface of thin silicon nitrite film 204, the surface of porous low-k dielectric layer becomes more dense and smooth.

After the above-described steps, the porous low-k dielectric layer has a dense and smooth surface that can improve the adhesion strength between the diffusion barrier layer and the porous low-k dielectric layer.

Figure 2D:
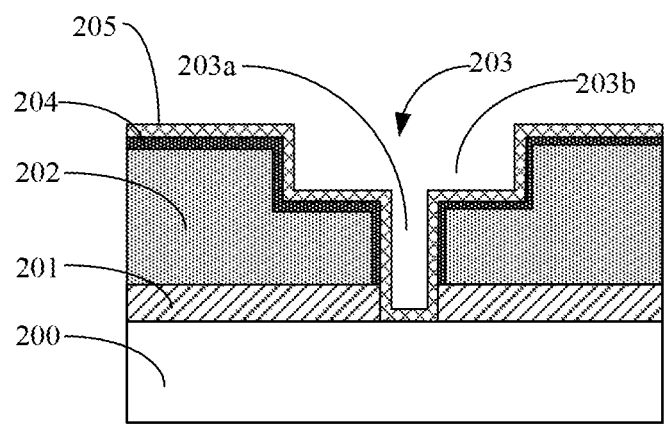

Referring to FIG. 2D, a diffusion barrier layer 205 is formed on sidewalls and bottoms of copper interconnect infrastructure 203. In the embodiment, diffusion barrier layer 205 is formed by a physical vapor deposition process that is performed at a temperature of about −40° C. to 400° C. and under a pressure of about 0.1 mTorr to about 100 Torr. Diffusion barrier layer 205 may be made of a metal or a metal compound, such as tantalum, tantalum nitride, titanium, titanium nitride, zirconium nitride, titanium-zirconium nitride, tungsten, tungsten nitride, alloys and combinations thereof.

Figure 2E:
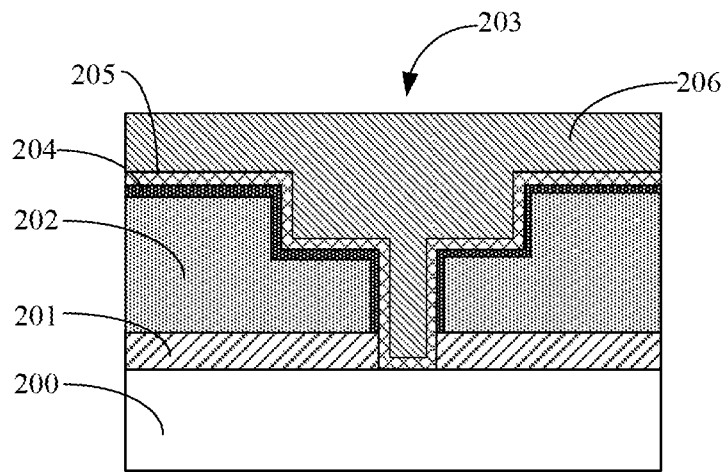
Figure 2F:
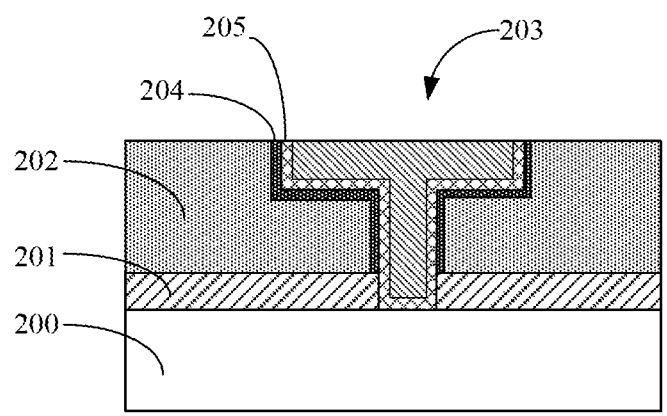

Referring to FIG. 2E, a copper interconnect layer 206 is filling through-hole 203a and trench 203b of copper interconnect structure 203. In the embodiment, copper interconnect layer 206 is filled using a plating process. In order to enhance adhesion between copper interconnect layer 206 and diffusion barrier layer 205, a copper seed layer is first formed on diffusion barrier layer 205 prior to forming copper interconnect layer 206. The copper seed layer is not shown in FIG. 2E for clarity.

Thereafter, a chemical mechanical polishing process is performed to expose the top surface of porous low-k dielectric layer 202.

The above-described process steps complete the copper interconnect structure.

According to the present invention, the surface of the copper interconnect structure is dense and smooth through subsequent helium plasma, nitrogen plasma and argon plasma treatments, thereby increasing adhesion of the diffusion barrier layer formed thereon and improving reliability and yield of the semiconductor device.

Figure 3:
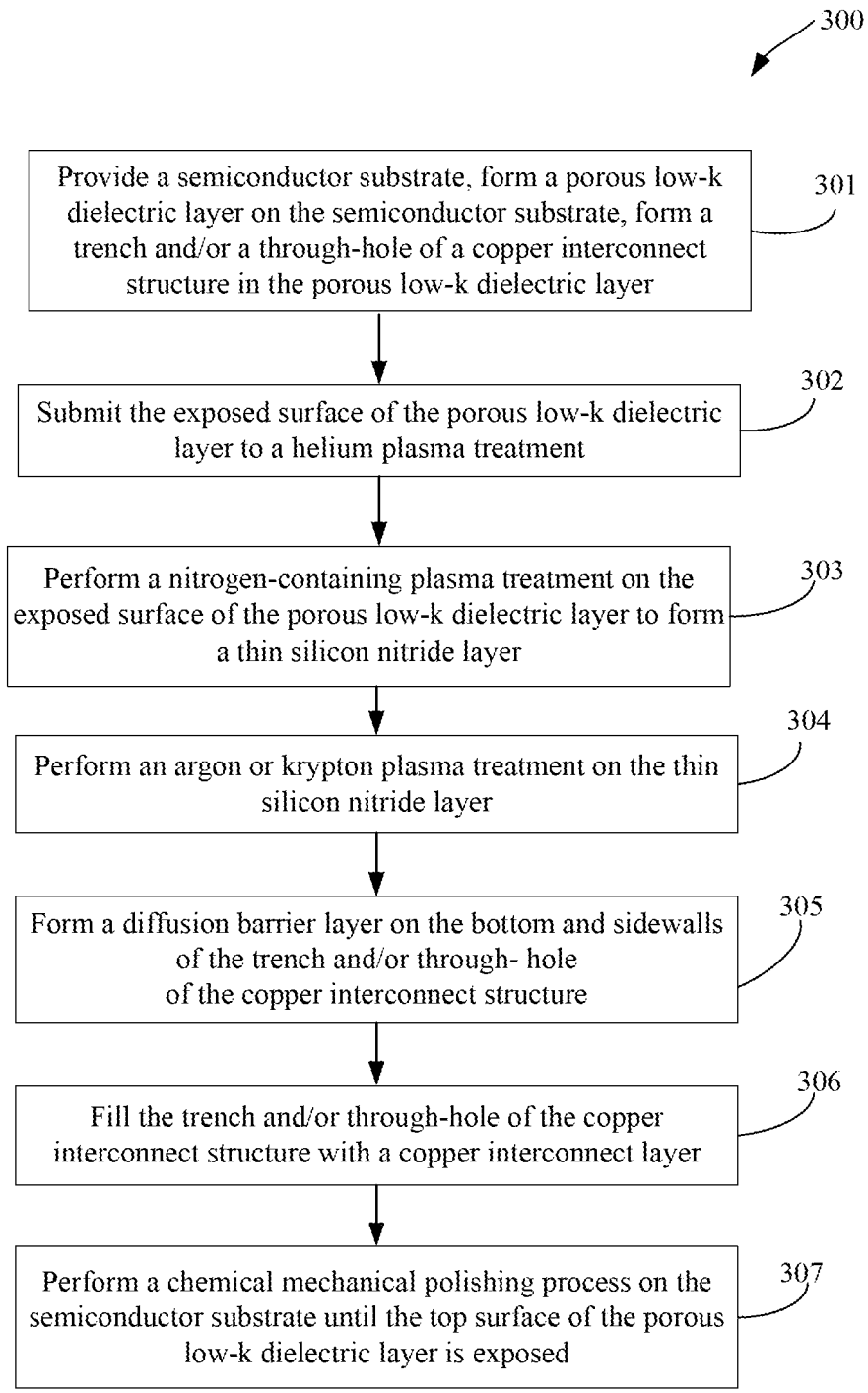
FIG. 3 is a simplified flow chart of a method for manufacturing a semiconductor device according to an embodiment of the present invention.

FIG. 3 is a simplified flow chart of a method 300 for fabricating a semiconductor device according to an embodiment of the present invention. Method 300 includes:

Step 301: providing a semiconductor substrate; forming a porous low-k dielectric layer on the semiconductor substrate; forming a through-hole and a trench of a copper interconnect structure in the porous low-k dielectric layer;

Step 302: performing a helium plasma treatment on the exposed surface of the porous low-k dielectric layer;

Step 303: performing a nitrogen or nitrogen-containing plasma treatment on the exposed surface of the porous low-k dielectric layer to form a thin silicon nitride layer;

Step 304: performing an argon or krypton plasma treatment on the thin silicon nitride layer;

Step 305: forming a diffusion barrier layer on the bottom and sidewalls of the through-hole and the trench of the copper interconnect structure;

Step 306: filling the through-hole and the trench of the copper interconnect structure with a copper interconnect layer;

Step 307: performing a chemical mechanical polishing process to expose a top surface of the porous low-k dielectric layer.

Embodiment 2

Figure 4:
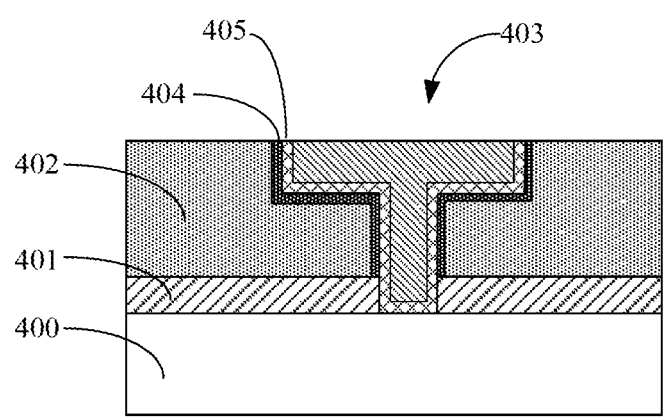
FIG. 4 is a cross-sectional view illustrating a semiconductor device structure according to an embodiment of the present invention.

FIG. 4 is a cross-sectional view illustrating a semiconductor device structure 40 according to an embodiment of the present invention. Semiconductor device structure 40 includes: a semiconductor substrate 400; a porous low-k dielectric layer 402 disposed on semiconductor substrate 400. In an embodiment, an etch stop layer 401 may be disposed between semiconductor substrate 400 and porous low-k dielectric layer 402. Semiconductor substrate 400 may be of an undoped silicon, doped silicon, silicon on insulator, and the like. By way of example, semiconductor substrate 400 is made of a monocrystaline silicon. Semiconductor substrate 400 may include isolation structures and various well structures, which are not shown for the sake of clarity. Semiconductor substrate 400 may include one or more front-end devices (not shown) formed thereon. A front-end device is referred to a semiconductor structure that has not gone through the back-end-of-the line (BEOL) process.

Etch stop layer 401 may include SiCN, SiC, SiN, or any combinations thereof.

Porous low-k dielectric layer 402 may be made of low-k materials having a dielectric constant k of less than about 4.0. Porous low-k dielectric layer 402 may be made of, but not limited to, SiO2, SiCOH, hydrogen silsesquioxane (HSQ with k=2.5 to 2.9), methyl silsesquioxane (MSQ with k=2.2), SiCH, SiCNH, $SiN_x$, and the like.

Semiconductor device structure 40 may further include a copper interconnect structure 403 disposed in porous low-k dielectric layer 402. Copper interconnect structure 403 is connected to a front-end device disposed on semiconductor substrate 400.

Semiconductor device structure 40 also includes a diffusion barrier layer 405 disposed between porous low-k dielectric layer 402 and copper interconnect structure 403, and a thin silicon nitride layer 404 disposed between porous low-k dielectric layer 402 and diffusion barrier layer 405. Because silicon nitride layer 404 has a smooth and dense surface, the adhesion strength between diffusion barrier layer 405 and silicon nitride layer 404 has increased. Diffusion barrier layer 405 is made of a metal or a metal compound, such as tantalum, tantalum nitride, titanium, titanium nitride, zirconium nitride, titanium-zirconium nitride, tungsten, tungsten nitride, alloys and combinations thereof. In an embodiment, thin silicon nitride layer 404 has a thickness in the range between about 10 Angstroms and about 80 Angstroms.

According to the present invention, a semiconductor device manufactured using the above-described process steps includes an interface layer between the porous low-k dielectric layer and the diffusion barrier layer. The smooth and dense surface of the interface layer increases the adhesion strength of the porous low-k dielectric layer and the diffusion barrier layer, and improves reliability and yield of the semiconductor device.

Embodiment 3

Embodiments of the present invention provide an electronic device including a semiconductor device that is manufactured by the above-described method of embodiment 1 or the above-described device structure of embodiment 2.

In accordance with the present invention, the electronic device may be a mobile phone, a laptop computer, a netbook, a tablet PC, a game console, a TV, a DVD player, a GPS device, a camera, a voice recorder, MP3, MP4, PSP players, and other semiconductor devices including intermediate products and electronic components that are manufactured using the above-described method to improve reliability and yield.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device comprising:
    a semiconductor substrate;
    a porous low-k dielectric layer;
    a copper interconnect structure in the porous low-k dielectric layer and having a through-hole in direct contact with an upper surface portion of the semiconductor substrate;
    a diffusion barrier layer disposed between the copper interconnect structure and the porous low-k dielectric layer and covering a bottom of the through hole; and
    a silicon nitride layer in direct contact with sidewalls of the porous low-k dielectric layer in a direction perpendicular to a planar surface of the semiconductor substrate.

2. The semiconductor device of claim 1, wherein the silicon nitride layer has a thickness in a range between 10 Angstroms and 80 Angstroms.

3. An electronic device comprising the semiconductor device of claim 1.

4. The semiconductor device of claim 1, further comprising an etch stop layer disposed between the semiconductor substrate and the porous low-k dielectric layer and having an opening for passing through the through-hole and having sidewalls covered by the diffusion barrier layer.

5. The semiconductor device of claim 4, wherein the etch stop layer comprises one of SiCN, SiC, and SiN.

6. The semiconductor device of claim 4, wherein the silicon nitride layer comprises a portion in contact with an upper surface of the etch stop layer.

7. The semiconductor device of claim 1, wherein the porous low-k dielectric layer comprises one of SiO2, SiOH, hydrogen silsesquioxane, methyl silsesquioxane, SiCH, SiCNH, and SiN.

8. The semiconductor device of claim 1, wherein the silicon nitride layer is not in contact with the semiconductor substrate.

9. The semiconductor device of claim 1, wherein the silicon nitride layer is in direct contact with an upper surface of the porous low-k dielectric layer in a lateral direction to the semiconductor substrate.

10. The semiconductor device of claim 1, wherein the diffusion barrier layer comprises a metal or a metal compound.

11. The semiconductor device of claim 10, wherein the metal compound comprises at least one element selected from the group consisting of tantalum, titanium, zirconium, and tungsten.

12. The semiconductor device of claim 1, wherein the silicon nitride layer is disposed between the diffusion barrier layer and the porous low-k dielectric layer.

* * * * *